United States Patent [19]
Potetz et al.

[11] Patent Number: 5,481,560
[45] Date of Patent: Jan. 2, 1996

[54] DIGITAL-TO-PULSE WIDTH CONVERTER UTILIZING A DISTRIBUTED PULSE WIDTH

[75] Inventors: Richard J. Potetz, West Granby, Conn.; William B. Adamec, Natick, Mass.

[73] Assignee: United Technologies Corporation, Hartford, Conn.

[21] Appl. No.: 234,315

[22] Filed: Apr. 28, 1994

[51] Int. Cl.$^6$ .................................. H03K 7/08; H03K 9/08
[52] U.S. Cl. .................................. 375/238; 370/9; 341/53; 332/110
[58] Field of Search .................................. 375/22; 370/8, 370/9; 340/825.63, 825.64, 825.65; 341/53; 332/110, 112

[56] References Cited

U.S. PATENT DOCUMENTS

| | | | |
|---|---|---|---|
| 4,117,476 | 9/1978 | Koyanagi | 340/347 |
| 4,233,591 | 11/1980 | Murata et al. | 455/179 |
| 4,530,421 | 3/1985 | Hareyama et al. | 340/347 |
| 4,590,457 | 5/1986 | Amir . | |

Primary Examiner—Stephen Chin
Assistant Examiner—Bryan Webster
Attorney, Agent, or Firm—Richard H. Kosakowski; Holland & Associates

[57] ABSTRACT

A digital-to-analog converter includes a digital-to-pulse width converter that converts a desired digital set-point value to a corresponding signal having a pulse width indicative of the desired set-point value. The desired set-point value is fed to a comparator which compares that value to the current count value from a counter that is counting up in ascending integer order. However, instead of presenting the counter output signal lines to the comparator in a normal conventional manner wherein the count value of the counter is presented to the comparator in the conventional ascending integer order, the current value of the counter is presented to the comparator in other than a conventional ascending order. The result is a comparator output signal that transitions more than one time between binary logic levels. This effectively increases the frequency of the comparator output signal. An optimum connection of the counter output signal lines to the comparator can be achieved such that the comparator output signal is divided up into a series of binary logic level pulses that are distributed across the entire cycle time period of the counter. This results in a subsequent output of an integrator that has reduced ripple voltage amplitude.

17 Claims, 2 Drawing Sheets

DIGITAL-TO-PULSE WIDTH CONVERTER UTILIZING A DISTRIBUTED PULSE WIDTH

BACKGROUND OF THE INVENTION

This invention relates to digital-to-pulse width converters, and more particularly to a digital-to-pulse width converter that provides a pulse width output that is divided up into a series of pulses that are distributed across the entire time period of the pulse width output.

Digital-to-pulse width converter circuits are commonly used as part of a circuit that, inexpensively converts a digital number to an analog value. The digital-to-pulse width converter circuit uses a single digital output pin to provide a binary logic level, pulse width signal that is proportional to a digital value (i.e., a desired set-point), the set-point being comprised of a plurality of binary digits ("bits"). An analog circuit, such as an integrator, then converts this pulse width binary signal to an analog voltage or current.

The resolution of the digital-to-pulse width converter is the number of different pulse width values that can be commanded by all possible set-points. A four bit digital set-point value allows sixteen different pulse width outputs; a sixteen state resolution. A five bit digital value allows for 32 different pulse width outputs; a 32 state resolution. For a fixed clock frequency input to the counter, the cycle time increases as the number of bits in the digital value increases. Adding one bit to the digital set-point value doubles not the resolution, but also the cycle time of the converter. This longer cycle time increases the response time of the counter, which is the time measured from the changing of the set-point to the pulse width output achieving the value commanded by the set-point. This longer cycle time may also increase the amount of ripple in the corresponding analog voltage or current output of the integrator.

Ripple is the amount of undesirable fluctuations in the amplitude of the integrator analog output signal. A smooth transition, relatively free of fluctuations, is desired as the analog output signal transitions between the previous set-point value to the new commanded set-point value. Also, it is desired that the integrator output signal have as little ripple as possible as the integrator integrates the current set-point value. Ripple can be eliminated during analog output signal transitions between old and new set-point values by selection of an appropriate time constant. However, there usually is some small amount of ripple in the integrator output signal as it integrates the constantly changing binary logic levels of the pulse width output signal for any current set-point value. That is, there are small fluctuations of the integrator analog output signal around the "steady-state" value that corresponds to the current set-point value.

A problem with prior art digital-to-analog converters that use a digital-to-pulse width conversion scheme is that when the digital set-point changes, the integrator takes a finite amount of time to integrate the pulse width output. That is, the integrator output does not change in a step-like, instantaneous manner. This is because the time constant of the integrator cannot be made arbitrarily small because the integrator must integrate the pulse width output adequately to achieve a relatively ripple-free integrator output signal. If the pulse width output signal was at a higher frequency, the integrator time constant could be made smaller, speeding up the response time of the integrator.

It is known in the prior art to divide up the pulse width output of a digital-to-pulse width converter into a series of pulses. This pulse width "distribution" method effectively increases the frequency of the pulse width output, which allows for use of an integrator with a lower time constant. This has the desirable result of reducing the response time of the analog output to the digital input. However, the time constant of the integrator is still set to a sufficiently long value such that a small amount of ripple is introduced into the integrator output during integration of the current set-point value.

Examples of prior art pulse width "distribution" methods are described in U.S. Pat. Nos. 4,233,591 and 4,590,457. However, both of these patents describe distribution methods that involve the addition of complex digital pulse distribution circuitry to the existing, relatively simplistic circuitry of a digital-to-pulse width converter. Also, both patents do not provide for an "optimum" distribution or dividing up of the pulse width output. An optimum distribution is one in which the pulse width output has been divided into a plurality of pulses that are distributed as evenly and equally as possible over the entire pulse width time period, taking into account all of the possible combinations of the distributed pulse width output signal.

Accordingly, it is a primary object of the present invention to provide a digital-to-pulse width converter having a pulse width output that is divided into a plurality of pulses that are distributed in an optimum configuration across the entire time period of the pulse width output.

It is general object of the present invention to provide a digital-to-pulse width converter, with a distributed binary pulse width output, which significantly reduces the complex additional circuitry required by prior art pulse width distribution schemes.

It is a further object of the present invention to provide a digital-to-pulse width converter, with a distributed binary pulse width output, which responds faster to selected digital set-point values because of the optimum distribution of the pulse width output.

It is still another object of the present invention to provide a digital-to-pulse width converter, with a distributed binary pulse width output, having an integrator for converting the pulse width output into an analog signal, the optimum distribution of the pulse width output allowing for a smaller time constant for the integrator, thereby decreasing the response time of the integrator.

It is yet another object of the present invention to reduce the amplitude of the ripple voltage in the integrator output signal as the integrator is integrating the currently-selected set-point value as indicated by a series of binary logic level pulses at the pulse width output.

The above and other objects and advantages of this invention will become more readily apparent when the following description is read in conjunction with the accompanying drawings.

SUMMARY OF THE INVENTION

To overcome the deficiencies of the prior art and to achieve the objects listed above, the Applicants have invented a digital-to-pulse width converter that provides a pulse width output that is divided up into a series of pulses that are distributed across the entire time period of the pulse width output.

In the preferred embodiment, the digital-to-pulse width converter comprises the front end of a digital-to-analog converter and includes a multiple-bit digital counter that is driven by an oscillator clock source of a predetermined frequency. The counter continuously counts up in value from zero to a maximum value determined by the number of internal bits in the counter, as reflected by the number of output signal lines emanating from the counter. For example, for a four bit counter, the counter counts up from zero to fifteen in integer increments, repeating continuously, one increment per clock pulse. The four output signal lines of the counter are connected to a comparator. Also connected to the comparator are a plurality of signal lines, equal in number to the counter output signal lines, emanating from a reference register. The register contains the digital set-point value equal to the desired value of the analog output voltage produced from an integrator connected to the distributed pulse width output of the digital-to-pulse width converter. The comparator continuously compares the reference register value to the current counter value and provides a binary logic "HI" distributed digital output signal if the reference register value is greater than the counter value, and provides a binary logic "LO" distributed digital output signal if the reference register value is less than or equal to the counter value.

The four output signal lines of the counter are each assigned weighted binary values by the counter. For example, bit zero (i.e., signal line "zero") has a weighting of one ($2^0$); bit one a weighting of two ($2^1$); bit two a weighting of four ($2^2$); and bit three a weighting of eight ($2^3$). In the prior art, the counter output signals were presented to the comparator in descending order of their weightings (i.e., "8, 4, 2, 1"). This resulted in the counter presenting to the comparator a count in integer ascending order (i.e., 0, 1, 2, ..., 13, 14, 15). This had the further result of providing a pulse width output signal from the comparator that transitioned a maximum of only one time between binary logic levels for any digital reference register set-point value.

In contrast, in accordance with the present invention, the four output signals from the counter are not presented to the comparator in descending order of their weightings. Instead, the counter output signal lines or bits are presented to the comparator out of order of their weightings. Any such out of order weighting presentation causes the value of the counter to be presented out of ascending integer order to the comparator. This results in the reference register digital set-point value sometimes being greater than, and sometimes being less than or equal to, the counter value at several times during the entire sixteen count time period of the counter. This causes the pulse width output signal of the comparator to transition more than once between its binary logic levels during the entire sixteen count time period of the counter, in contrast to the prior art. This effectively increases the frequency of the comparator output signal, carrying with it all of the attendant benefits described hereinbefore; for example, such as allowing for an integrator with a smaller time constant to be used.

The digital output frequency from the pulse width modulator can be selected by the connection of the counter to the comparator, in accordance with the present invention. The maximum digital output frequency is often not the best choice for a particular application of this circuit. The digital output frequency is chosen based on competing characteristics of accuracy, integrator cost, output ripple, and response time.

DETAILED DESCRIPTION OF THE PREFERRED EMBODIMENTS

Figure 1:
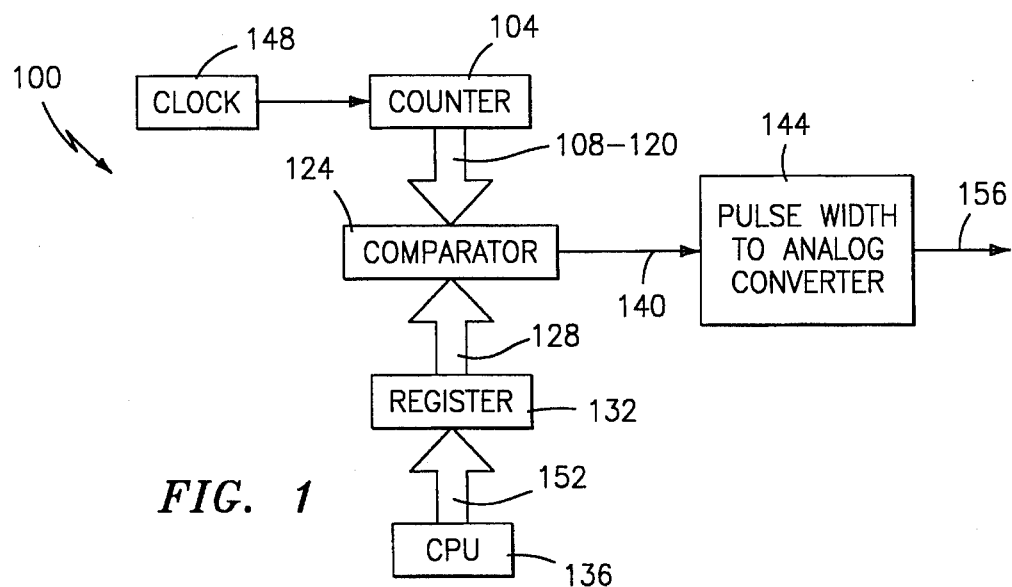
FIG. 1 is a block diagram illustration of a digital-to-analog converter utilizing a digital-to-pulse width converter circuitry in accordance with the present invention as a part thereof.

Referring to the drawings in detail, a preferred embodiment of a digital-to-pulse width converter as part of a digital-to-analog converter is illustrated and generally designated by the reference numeral 100. The digital-to-pulse width converter 100 includes a four bit counter 104, whose output bits 108–120 are fed to a four bit comparator 124. Also fed to the comparator 124 is the four bit output 128 of a register 132. The register 132, which may be connected to a central processing unit ("CPU") 136, contains a desired value of a pulse width. The comparator 124 compares the register value with the current value of the counter 104 and provides a binary logic pulse width output signal on a line 140 to a pulse width-to-analog converter 144, such as an integrator. The binary logic level of the pulse width output signal 140 depends upon whether the desired set point value in the register 132 is either greater than, equal to or less than the current counter value.

Referring now to FIG. 1, there illustrated is a block diagram of a digital-to-analog converter incorporating the digital-to-pulse width converter 100 of the present invention. A binary state clock signal at a fixed frequency is provided from a clock circuit 148, such as an oscillator. The clock frequency may be any value, but in the exemplary embodiment described herein, the clock frequency is 1.0 MHz. The clock signal is fed to a four bit counter 104. The counter 104 runs continuously at the 1.0 MHz clock rate in counting through $2^4=16$ states (i.e., from 0 to 15).

The current state of the counter 104 is output on a four bit signal bus 108–120 to the four bit comparator 124. The CPU 136 provides a desired pulse width on a data bus 152 to the register 132 which, in the exemplary embodiment of the present invention, has four bits. The register 132 provides the four bit output signal on a signal bus 128 to the comparator 124. The comparator 124 compares the desired pulse width value with the current value of the counter 104. If the register value is greater than the current counter value, the comparator 124 provides a binary logic level HI signal on the signal line 140 to the integrator 144. A typical voltage level for binary logic level HI is +5.0 VDC. Alternatively, if the register value is less than or equal to the current counter value, the comparator 124 provides a binary logic level LO to the integrator 144. A typical voltage level for binary logic level LO is 0 VDC. The integrator 144 continuously integrates the binary logic level HI or LO voltage levels provided at its input, and provides a corresponding analog voltage at its output on a signal line 156.

Figure 2:
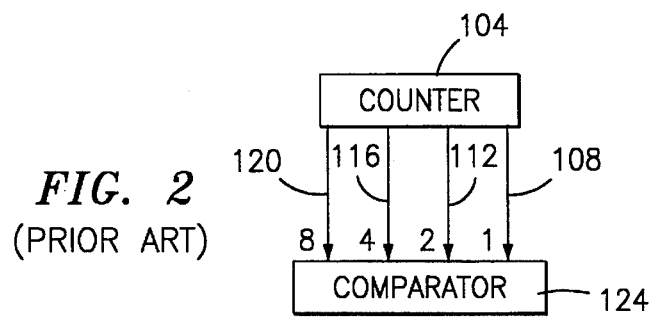
FIG. 2 is a prior art block diagram of a portion of a known connection between a counter and a comparator that both comprise a part of a digital-to-pulse width converter circuit.

FIG. 2 illustrates a known, prior art connection of the four output bits 108–120 of the counter 104 to the comparator 124. Connected from right to left in FIG. 2, the signals 108–120 are labeled according to their binary weightings. That is, the first signal line 108, labeled "1", has a weighting of one; that is, $2^0=1$. The next signal line 112 to the left, labeled as numeral "2" has a weighting of 2; that is, $2^1=2$. The next signal line 116 to the left labeled "4" has a weighting of 4; that is $2^2=4$. Finally, the leftmost signal line 120, labeled "8", has a weighting of 8; $2^3=8$. This type of connection of the four counter bits 108–120 to the comparator 124 in ascending order from right to left is referred to as the "conventional" connection. When the counter output bits 108–120 are presented to the comparator 124 in this conventional manner, the resulting count indicated by these bits 108–120 is a conventional, integer-ascending, up-count from zero up through fifteen and then restarting from zero again. Table 1, under the heading "counter" is indicative of the count sequence from zero through fifteen in integer ascending order. The columns labeled "8", "4", "2" and "1" correspond to the counter signal lines 108–120. The "0s" and "1s" in the counter columns in Table I indicate the binary logic levels that are present on the counter output signal lines 108–120.

In Table I, the row of numerals labeled "15, 14, 13. . . 2, 1 and 0" indicate the sixteen possible digital set points commanded by the register 132 and fed to the comparator 124. The "1s" and "0s" in each column in Table I under the sixteen different set points indicate the binary logic level at the comparator output 140. If the desired register set point value is greater than the current counter value, then the comparator output 140 is a binary logic level HI; i.e., "1". Conversely, if the commanded set-point value is less than or equal to the current counter value, the comparator output signal 140 is a binary logic level LO; i.e., a "0".

In the conventional counter connection of FIG. 2, the four bit counter 104 runs continuously at the exemplary clock frequency of 1.0 MHz. Thus, each state of the counter 104 lasts for 1 microsecond. The counter 104 cycles through all $2^4=16$ states in 16 microseconds, establishing an overall pulse width frequency of 1/16 microseconds, or 62.5 KHz. From Table I, it can be seen that a set point of 0 results in a condition where the register value never exceeds a counter value. Thus, the comparator output 140 is a binary logic level "LO" (i e., "0"), for all sixteen states of the counter 104; in other words, for the entire sixteen microseconds of the overall pulse width. Then, if the amount of time that the comparator output 140 assumes a binary logic level HI (i.e., a "1") is referred to as the pulse width, then a pulse width of zero seconds is achieved by setting the set point to zero.

At the other extreme, if the set point is 15, then the register value will exceed the counter value for fifteen out of the sixteen possible counts of the counter. The comparator output 140, in this instance, is a binary logic level HI (i.e., a "1") for the first fifteen counts of the counter 104, and is a binary logic level LO for the last or fifteenth state of the counter 104. In this instance, the pulse width will have a duration of fifteen microseconds out of the entire sixteen microsecond overall pulse width period.

Figure 5:
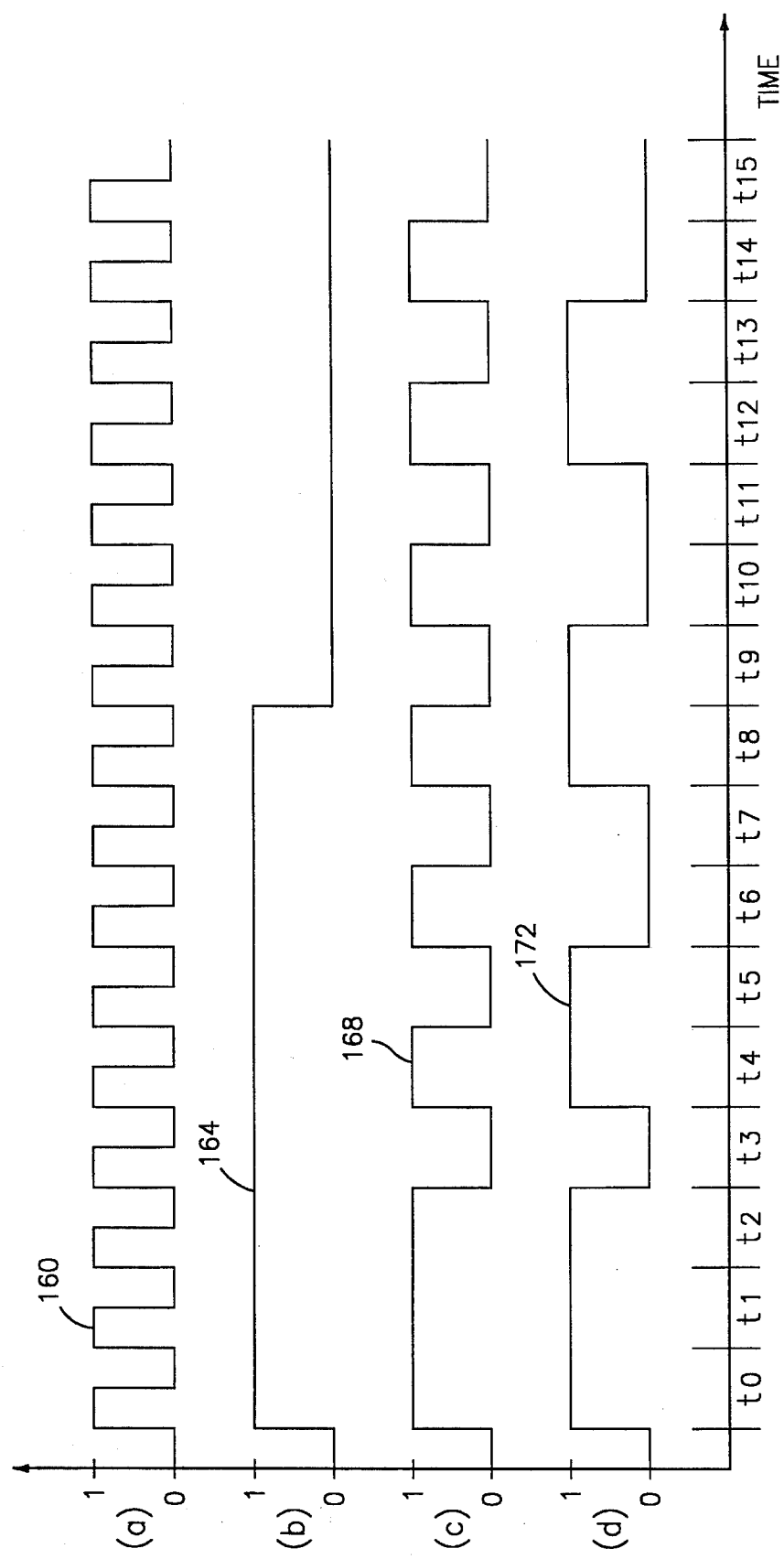
FIG. 5 illustrates various timing diagrams of binary logic voltage levels at the output of various components of the digital-to-pulse width converter circuit of FIG. 1.

For set points in between the two extremes (that is, between set points of zero and fifteen), the comparator output 140 can be seen from Table I. Note, however, that for the set points from one through fifteen, inclusive, the comparator output 140 transitions from a binary logic level HI to a binary logic level LO only once during the entire sixteen bit count of the counter 104. This is best illustrated in the timing diagrams of FIG. 5, wherein the waveform 160 of FIG. 5(a) illustrates the clock signal fed to the counter 104. The waveform 164 of FIG. 5(b) illustrates the comparator output 140 for a set-point of nine with a conventional counter 104 connection to the comparator 124, as illustrated in FIG. 2. Comparing FIG. 5(b) with Table I, it can be seen that the comparator output 140 is at a binary logic level HI for the first nine states of the counter 104 (i.e., from zero through eight). Then, for the tenth through sixteenth states of the counter 104, the comparator output 140 is a binary logic level LO. The single transition of the comparator output 140 from a binary logic level HI to a binary logic level LO, during the entire sixteen bit counter output period, is illustrated by the waveform 164 of FIG. 5(b).

TABLE I

•CONVENTIONAL CONNECTION OF COUNTER TO COMPARATOR
•MINIMUM FREQUENCY COMPARATOR OUTPUT

| COUNTER | | | | SET POINTS/ COMPARATOR OUTPUT | | | | | | | | | | | | | | | |
|---|---|---|---|---|---|---|---|---|---|---|---|---|---|---|---|---|---|---|---|
| 8 | 4 | 2 | 1 | 15 | 14 | 13 | 12 | 11 | 10 | 9 | 8 | 7 | 6 | 5 | 4 | 3 | 2 | 1 | 0 |
| 0 | 0 | 0 | 0 | 1 | 1 | 1 | 1 | 1 | 1 | 1 | 1 | 1 | 1 | 1 | 1 | 1 | 1 | 1 | 0 |
| 0 | 0 | 0 | 1 | 1 | 1 | 1 | 1 | 1 | 1 | 1 | 1 | 1 | 1 | 1 | 1 | 1 | 1 | 0 | 0 |
| 0 | 0 | 1 | 0 | 1 | 1 | 1 | 1 | 1 | 1 | 1 | 1 | 1 | 1 | 1 | 1 | 1 | 0 | 0 | 0 |
| 0 | 0 | 1 | 1 | 1 | 1 | 1 | 1 | 1 | 1 | 1 | 1 | 1 | 1 | 1 | 1 | 0 | 0 | 0 | 0 |
| 0 | 1 | 0 | 0 | 1 | 1 | 1 | 1 | 1 | 1 | 1 | 1 | 1 | 1 | 1 | 0 | 0 | 0 | 0 | 0 |
| 0 | 1 | 0 | 1 | 1 | 1 | 1 | 1 | 1 | 1 | 1 | 1 | 1 | 1 | 0 | 0 | 0 | 0 | 0 | 0 |
| 0 | 1 | 1 | 0 | 1 | 1 | 1 | 1 | 1 | 1 | 1 | 1 | 1 | 0 | 0 | 0 | 0 | 0 | 0 | 0 |
| 0 | 1 | 1 | 1 | 1 | 1 | 1 | 1 | 1 | 1 | 1 | 1 | 0 | 0 | 0 | 0 | 0 | 0 | 0 | 0 |
| 1 | 0 | 0 | 0 | 1 | 1 | 1 | 1 | 1 | 1 | 1 | 0 | 0 | 0 | 0 | 0 | 0 | 0 | 0 | 0 |
| 1 | 0 | 0 | 1 | 1 | 1 | 1 | 1 | 1 | 1 | 0 | 0 | 0 | 0 | 0 | 0 | 0 | 0 | 0 | 0 |
| 1 | 0 | 1 | 0 | 1 | 1 | 1 | 1 | 1 | 0 | 0 | 0 | 0 | 0 | 0 | 0 | 0 | 0 | 0 | 0 |
| 1 | 0 | 1 | 1 | 1 | 1 | 1 | 1 | 0 | 0 | 0 | 0 | 0 | 0 | 0 | 0 | 0 | 0 | 0 | 0 |
| 1 | 1 | 0 | 0 | 1 | 1 | 1 | 0 | 0 | 0 | 0 | 0 | 0 | 0 | 0 | 0 | 0 | 0 | 0 | 0 |
| 1 | 1 | 0 | 1 | 1 | 1 | 0 | 0 | 0 | 0 | 0 | 0 | 0 | 0 | 0 | 0 | 0 | 0 | 0 | 0 |
| 1 | 1 | 1 | 0 | 1 | 0 | 0 | 0 | 0 | 0 | 0 | 0 | 0 | 0 | 0 | 0 | 0 | 0 | 0 | 0 |
| 1 | 1 | 1 | 1 | 0 | 0 | 0 | 0 | 0 | 0 | 0 | 0 | 0 | 0 | 0 | 0 | 0 | 0 | 0 | 0 |

The comparator output signal 140 is fed to the integrator 144, which continuously integrates this signal 140 and provides an analog equivalent signal 156 at its output. The integrator voltage output 156 will increase somewhat during the nine clock periods when the comparator output 140 is at a binary logic level HI. Conversely, the integrator output voltage 156 will decrease during the seven counter output periods that the comparator output 140 is at a binary logic level LO. If the set point were to remain at nine for several cycles, then the integrator output 156 would continuously fluctuate between these two high and low values. These fluctuations show up as ripple voltage in the integrator output 156. It follows from the foregoing intuitively that if the comparator output 140 was allowed to transition between binary logic level HI and binary logic level LO states several times during one complete sixteen bit counter output cycle, then the magnitude of the ripple voltage at the integrator output 156 would be lessened. This is due to the fact that the integrator 144 would spend less of a continuous time integrating a binary logic level HI voltage, and less of a continuous time integrating a binary logic level LO voltage. This concept of dividing up the pulse width output 140 of the comparator 124 into a series of several binary logic level HI and binary logic level LO signals throughout each single sixteen bit counter output period, and distributing these "pulses" over a single sixteen bit counter output period, is the underlying predication of the present invention.

Figure 3:
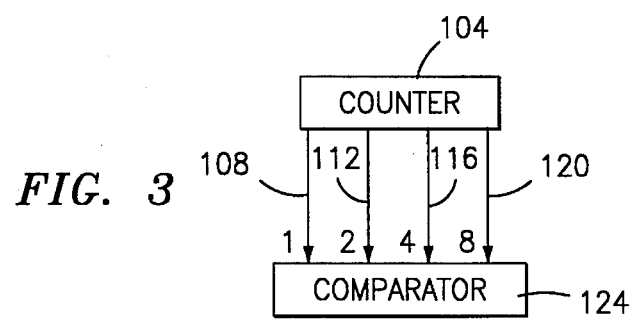
FIG. 3 is a block diagram of one embodiment of a connection between a counter and a comparator that both comprise a portion of the digital-to-pulse width converter circuit of the present invention of FIG. 1.

It has been discovered that this pulse width division and distribution can be achieved by simply changing the presentation of the counter bits 108–120 to the comparator 124, such that the weightings of the bits (in binary terms) are presented to the comparator 124 to make the counter 104 appear to be counting out of its normal ascending, integer sequence. FIG. 3 illustrates one embodiment of the present invention where the four counter output signals 108–120 are presented to the comparator 124 in other than conventional order. Therein, the four counter output signals 108–120 are completely reversed from the conventional connection of FIG. 2. Table II is illustrative of the new count sequence presented to the comparator 124.

between a binary logic level HI and a binary logic level LO. This has the effect of increasing the output frequency of the comparator output signal 140. Then, as discussed hereinbefore, increasing the comparator output signal frequency has a major resultant benefit of reducing the amount of ripple voltage in the integrator output 156.

Referring to the waveform 168 of FIG. 5(*c*) and Table II, therein is illustrated the comparator output 140 for a set point of nine. As compared to the conventional connection of a set point of nine, illustrated by the waveform 164 of FIG. 5(*b*), it can be seen that the comparator output 140 transitions from a binary logic level HI to a binary logic level LO a total of seven times during one complete counter output cycle. This is in contrast to the single transition of the comparator output signal 140 from a binary logic level HI to a binary logic level LO for the conventional counter connection. It has been discovered that by connecting the four counter output bits 108–120 to the comparator 124 as in FIG. 3, the comparator output 140 achieves its maximum switching frequency (that is, the maximum number of times that it transitions between binary logic level HI and LO states).

With a maximum switching frequency, the magnitude of the ripple voltage at the integrator output 156 is at its minimum value. In other words, the integrator output 156 does not spend as much continuous time either above or below the steady state output. This is due to the fact that any continuous amounts of time that the comparator output 140 is at either a binary logic level HI or LO level is reduced to

TABLE II

•COMPLETELY REVERSED CONNECTION OF COUNTER TO COMPARATOR
•MAXIMUM FREQUENCY COMPARATOR OUTPUT

| COUNTER | | | | SET POINTS/ COMPARATOR OUTPUT | | | | | | | | | | | | | | |
|---|---|---|---|---|---|---|---|---|---|---|---|---|---|---|---|---|---|---|
| 1 | 2 | 4 | 8 | 15 | 14 | 13 | 12 | 11 | 10 | 9 | 8 | 7 | 6 | 5 | 4 | 3 | 2 | 1 | 0 |
| 0 | 0 | 0 | 0 | 1 | 1 | 1 | 1 | 1 | 1 | 1 | 1 | 1 | 1 | 1 | 1 | 1 | 1 | 1 | 0 |
| 1 | 0 | 0 | 0 | 1 | 1 | 1 | 1 | 1 | 1 | 1 | 0 | 0 | 0 | 0 | 0 | 0 | 0 | 0 | 0 |
| 0 | 1 | 0 | 0 | 1 | 1 | 1 | 1 | 1 | 1 | 1 | 1 | 1 | 1 | 1 | 0 | 0 | 0 | 0 | 0 |
| 1 | 1 | 0 | 0 | 1 | 1 | 1 | 0 | 0 | 0 | 0 | 0 | 0 | 0 | 0 | 0 | 0 | 0 | 0 | 0 |
| 0 | 0 | 1 | 0 | 1 | 1 | 1 | 1 | 1 | 1 | 1 | 1 | 1 | 1 | 1 | 1 | 1 | 0 | 0 | 0 |
| 1 | 0 | 1 | 0 | 1 | 1 | 1 | 1 | 1 | 0 | 0 | 0 | 0 | 0 | 0 | 0 | 0 | 0 | 0 | 0 |
| 0 | 1 | 1 | 0 | 1 | 1 | 1 | 1 | 1 | 1 | 1 | 1 | 1 | 0 | 0 | 0 | 0 | 0 | 0 | 0 |
| 1 | 1 | 1 | 0 | 1 | 0 | 0 | 0 | 0 | 0 | 0 | 0 | 0 | 0 | 0 | 0 | 0 | 0 | 0 | 0 |
| 0 | 0 | 0 | 1 | 1 | 1 | 1 | 1 | 1 | 1 | 1 | 1 | 1 | 1 | 1 | 1 | 1 | 1 | 0 | 0 |
| 1 | 0 | 0 | 1 | 1 | 1 | 1 | 1 | 1 | 1 | 0 | 0 | 0 | 0 | 0 | 0 | 0 | 0 | 0 | 0 |
| 0 | 1 | 0 | 1 | 1 | 1 | 1 | 1 | 1 | 1 | 1 | 1 | 1 | 1 | 0 | 0 | 0 | 0 | 0 | 0 |
| 1 | 1 | 0 | 1 | 1 | 1 | 0 | 0 | 0 | 0 | 0 | 0 | 0 | 0 | 0 | 0 | 0 | 0 | 0 | 0 |
| 0 | 0 | 1 | 1 | 1 | 1 | 1 | 1 | 1 | 1 | 1 | 1 | 1 | 1 | 1 | 1 | 0 | 0 | 0 | 0 |
| 1 | 0 | 1 | 1 | 1 | 1 | 1 | 1 | 0 | 0 | 0 | 0 | 0 | 0 | 0 | 0 | 0 | 0 | 0 | 0 |
| 0 | 1 | 1 | 1 | 1 | 1 | 1 | 1 | 1 | 1 | 1 | 0 | 0 | 0 | 0 | 0 | 0 | 0 | 0 | 0 |
| 1 | 1 | 1 | 1 | 0 | 0 | 0 | 0 | 0 | 0 | 0 | 0 | 0 | 0 | 0 | 0 | 0 | 0 | 0 | 0 |

Instead of appearing to be counting in a conventional manner from zero up through fifteen in integer ascending order, the counter 104 (which internally always counts up in integer ascending order, regardless of the connection of its output signal lines to the comparator) presents its counts to the comparator 124 in a non-conventional order, wherein the count begins with zero and continues through the following sequence: 8, 4, 12, 2, 10, 6, 14, 1, 9, 5, 13, 3, 11, 7 and 15. Table II also illustrates the comparator output 140 for all sixteen possible set points. It can be seen that by comparing Table I with Table II, the comparator output 140 is similar for the conventional connection and the completely reversed connection for only those set points of 0, 1 and 15. For all other set points, the comparator output 140 transitions more than one time a minimum. However, the integrator 144 may not be able to handle such a maximum switching frequency. This results in switching errors in the integrator output 156.

Thus, in accordance with another embodiment of the present invention, an "optimum" connection of the counter output bits 108–120 to the comparator 124 has been achieved. This optimum connection of the counter bits 108–120 to the comparator 124 results in a ideal pulse width distribution, which is one that will still result in very low ripple, yet will eliminate possibilities for switching errors in the integrator 144. Some design rules or characteristics of an ideal or optimum pulse width distribution are that no pulse width section (that is, any amount of time that the comparator output signal 140 spends at either a binary logic level HI or LO levels) cannot exceed any other pulse width section by more than one counter cycle; and the pulse width distribution is balanced throughout the entire sixteen bit counter cycle such that existing unequal pulse width sections are symmetrically distributed throughout the entire sixteen bit counter output period.

Figure 4:
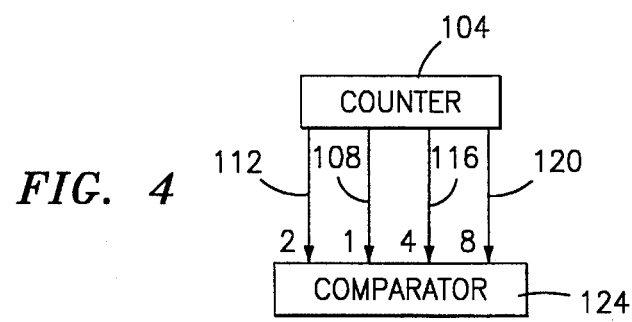
FIG. 4 is a block diagram of a second embodiment of a connection between the counter and the comparator that form a portion of the digital-to-pulse width converter circuit of FIG. 1.

FIG. 4 and Table III are illustrative of an ideal or optimum connection of the four counter output signal lines 108–120 to the comparator 124. As compared to the conventional connection of FIG. 2, the counter output bits 108–120 are initially shifted left twice, and then the two "new" resulting least significant bits ("LSBs") 108, 112 are reversed in order. The resulting counter connection is illustrated in FIG. 4. The resulting counter sequence is illustrated in Table III.

to the conventional circuit of FIG. 2 where maximum ripple amplitude is generated with a fifty percent duty cycle selected by the set-point of eight or nine, as illustrated with a set-point of 9 in FIG. 5(*b*). This is an important advantage with the present invention because a fifty percent duty cycle point is often a set-point that is normally selected by digital-to-analog conversion circuitry.

The present invention has been described in a preferred embodiment as utilizing a four bit counter 104. However, it is to be understood that such a four bit counter 104 and corresponding four bit register 132 and a comparator 124, are purely exemplary. The broadest scope of the invention is not limited as such. Instead, a counter 104, comparator 124

TABLE III

•"OPTIMIZED" CONNECTION OF COUNTER TO COMPARATOR
(COUNTER BITS SHIFTED LEFT TWICE; TWO "NEW" LSBs REVERSED)
•INTERMEDIATE FREQUENCY OUTPUT

| COUNTER | | | | SET POINTS/ COMPARATOR OUTPUT | | | | | | | | | | | | | | | |
|---|---|---|---|---|---|---|---|---|---|---|---|---|---|---|---|---|---|---|---|
| 2 | 1 | 4 | 8 | 15 | 14 | 13 | 12 | 11 | 10 | 9 | 8 | 7 | 6 | 5 | 4 | 3 | 2 | 1 | 0 |
| 0 | 0 | 0 | 0 | 1 | 1 | 1 | 1 | 1 | 1 | 1 | 1 | 1 | 1 | 1 | 1 | 1 | 1 | 1 | 0 |
| 0 | 1 | 0 | 0 | 1 | 1 | 1 | 1 | 1 | 1 | 1 | 1 | 1 | 1 | 0 | 0 | 0 | 0 | 0 | 0 |
| 1 | 0 | 0 | 0 | 1 | 1 | 1 | 1 | 1 | 1 | 1 | 0 | 0 | 0 | 0 | 0 | 0 | 0 | 0 | 0 |
| 1 | 1 | 0 | 0 | 1 | 1 | 1 | 0 | 0 | 0 | 0 | 0 | 0 | 0 | 0 | 0 | 0 | 0 | 0 | 0 |
| 0 | 0 | 1 | 0 | 1 | 1 | 1 | 1 | 1 | 1 | 1 | 1 | 1 | 1 | 1 | 1 | 0 | 0 | 0 | 0 |
| 0 | 1 | 1 | 0 | 1 | 1 | 1 | 1 | 1 | 1 | 1 | 1 | 0 | 0 | 0 | 0 | 0 | 0 | 0 | 0 |
| 1 | 0 | 1 | 0 | 1 | 1 | 1 | 1 | 1 | 0 | 0 | 0 | 0 | 0 | 0 | 0 | 0 | 0 | 0 | 0 |
| 1 | 1 | 1 | 0 | 1 | 0 | 0 | 0 | 0 | 0 | 0 | 0 | 0 | 0 | 0 | 0 | 0 | 0 | 0 | 0 |
| 0 | 0 | 0 | 1 | 1 | 1 | 1 | 1 | 1 | 1 | 1 | 1 | 1 | 1 | 1 | 1 | 1 | 1 | 0 | 0 |
| 0 | 1 | 0 | 1 | 1 | 1 | 1 | 1 | 1 | 1 | 1 | 1 | 1 | 0 | 0 | 0 | 0 | 0 | 0 | 0 |
| 1 | 0 | 0 | 1 | 1 | 1 | 1 | 1 | 1 | 0 | 0 | 0 | 0 | 0 | 0 | 0 | 0 | 0 | 0 | 0 |
| 1 | 1 | 0 | 1 | 1 | 1 | 0 | 0 | 0 | 0 | 0 | 0 | 0 | 0 | 0 | 0 | 0 | 0 | 0 | 0 |
| 0 | 0 | 1 | 1 | 1 | 1 | 1 | 1 | 1 | 1 | 1 | 1 | 1 | 1 | 1 | 0 | 0 | 0 | 0 | 0 |
| 0 | 1 | 1 | 1 | 1 | 1 | 1 | 1 | 1 | 1 | 1 | 0 | 0 | 0 | 0 | 0 | 0 | 0 | 0 | 0 |
| 1 | 0 | 1 | 1 | 1 | 1 | 1 | 1 | 0 | 0 | 0 | 0 | 0 | 0 | 0 | 0 | 0 | 0 | 0 | 0 |
| 1 | 1 | 1 | 1 | 0 | 0 | 0 | 0 | 0 | 0 | 0 | 0 | 0 | 0 | 0 | 0 | 0 | 0 | 0 | 0 |

The new counter sequence is as follows: 0, 4, 8, 10, 2, 6, 10, 14, 1, 5, 9, 13, 3, 7, 11 and 15. Table III also illustrates the resulting comparator output signal 140 for all sixteen possible commanded set points. The waveform 172 of FIG. 5(*d*) illustrates the comparator output signal 140 when the set point equals nine. Comparing FIG. 5(*d*) with FIG. 5(*b*) and FIG. 5(*c*), it can be seen that the comparator output signal 140 transitions from a binary logic level HI to a binary logic level LO four times during the entire sixteen bit counter output cycle. This is a smaller switching frequency than the maximum switching frequency achieved with the completely reversed counter connection of FIG. 5(*c*) and FIG. 3, but nevertheless, is still greater than the single transition or slowest switching frequency characterized by the conventional counter connection of FIG. 2 and FIG. 5(*b*). Thus, the integrator output 156, because of the comparator output signal 140 of FIG. 5(*d*), would have somewhat higher ripple magnitude than that of FIG. 5(*c*), yet the magnitude of the ripple would still be considerably less than that resulting from the comparator output signal 140 of FIG. 5(*b*).

It can be seen from the foregoing that the connection of the counter output bits 108–120 to the comparator 124 in a non-conventional manner, according to the present invention, results in less ripple in the integrator output 156. Further, as compared to the aforedescribed prior art patents, the present invention achieves its distributed pulse width and reduced ripple with no complex additional circuitry. Still further, the present invention generates minimal ripple with a fifty percent duty cycle selected by the set point; that is, when the set point is approximately 8 or 9. This is in contrast and register 132 operating on more or less than four bits may be utilized in light of the teachings herein. For example, if a five bit counter 104, comparator 124 and register 132 are utilized, the optimum configuration would have the five bits of the counter 104 being shifted left three times and then the resulting "new" LSBs would then be reversed in order before presentation to the comparator 124. Other connections for counters 104 other than four or five bits should be apparent to one of ordinary skill in the art in light of the teachings herein.

The present invention has also been described in conjunction to exemplary embodiments in which the four bits 108–120 of the counter 104 are presented to the comparator 124 in non-conventional manners. It is to be understood however that these two non-conventional connections are not exhaustive. For a four bit counter 104, there exists twenty-four different possible connections of the four bits 108–120 to the comparator 124 (i.e., 4!). FIG. 2 is illustrative of one possible connection of the counter bits 108–120 to the comparator 124, the conventional connection. FIGS. 3 and 4 are illustrative of two other possible connections of the counter bits 108–120 to the comparator 124; two non-conventional connections. There exists twenty-one other non-conventional connections of the counter bits 108–120 to the comparator 124. All twenty-one of these other non-conventional connections are contemplated by the broadest scope of the present invention. However, as described in detail hereinbefore, FIG. 4 represents what is considered to be an "optimum" connection of four counter bits 108–120 to the comparator 124.

Further, the invention has been described for use with a counter 104 that counts up in integer ascending order from zero to its maximum value; here, fifteen. However, it is to be understood that a down counter 104 may be used instead, in light of the teachings herein, without departing from the broadest scope of the present invention. Still further, the comparator 124 has been described as operating on rules where its output signal is at one logic level when the registered value exceeds the current counter value, and at a second logic level when the register value is less than or equal to the current counter value. However, other rules for the comparator output 140 assuming either one of its two binary logic levels states can be utilized in light of the teachings herein.

The invention has been described as utilizing a CPU 136 in conjunction with a register 132. However, the CPU 136 and register 132 are purely exemplary; other means and methodologies for presenting a desired set-point digital value indicative of a desired pulse width output at the comparator output 140 may be utilized without departing from the broadest scope of the present invention. For example, the CPU 136 may feed a desired set-point value directly to the comparator 124. Alternatively, the desired set-point value may be stored in memory (not shown). Further, the desired set-point value has been described as being fed to the comparator 124 over a four bit parallel digital data bus 128. However, the means and method of transfer of the desired set-point value to the comparator is irrelevant to the broadest scope of the present invention. For example, the desired set-point value may be fed over a single serial digital data line to the comparator 124.

Also, the pulse width-to-analog converter 144 has been illustrated as comprising an integrator which integrates the pulse width output signal on the line 140 from the comparator 124 into an analog voltage value. However, the pulse width-to-analog converter 144 may comprise any other type of suitable means for converting the comparator output 140 to an analog voltage or current value 156.

It should be understood by those skilled in the art that obvious structural modifications can be made without departing from the spirit of the invention. Accordingly, reference should be made primarily to the accompanying claims, rather than the foregoing specification, to determine the scope of the invention.

Having thus described the invention, what is claimed is:

1. A digital-to-analog converter for converting a predetermined digital value into a corresponding analog value, comprising:

a. a digital-to-pulse width converter;

b. a pulse width-to-analog converter;

c. wherein the digital-to-pulse width converter comprises a counter that counts between two predetermined numbers and provides its internal count value on a plurality of counter output signal lines, and a comparator that compares the counter internal count value on the counter output signal lines to a predetermined set point value and provides a comparator output signal at a first logic level indicative of a first type of result of the comparison of the counter count value on the counter output signal lines with the predetermined set point value and provides the comparator output signal at a second logic level indicative of a second type of result of the comparison of the counter count value on the counter output signal lines with the predetermined set point value, wherein the counter output signal lines are connected to the comparator such that the internal count value of the counter is presented to the comparator in other than an integer ascending order between the two predetermined numbers; and d. wherein the pulse width-to-analog converter comprises means for converting the comparator output signal to an analog value.

2. The digital-to-analog converter of claim 1, wherein the counter counts internally in ascending integer order beginning at zero and continuing up to a maximum determined by a number of internal bits in the counter.

3. The digital-to-analog converter of claim 1, wherein the comparator provides the comparator output signal at the first logic level when the predetermined set point value is greater than the counter count value on the counter output signal lines, and the comparator provides the comparator output signal at the second logic level when the predetermined set point value is less than or equal to the counter count value on the counter output signal lines.

4. The digital-to-analog converter of claim 1, wherein the means for converting the comparator output signal to an analog value comprises an integrator that integrates the comparator output signal and provides a corresponding analog voltage value.

5. A digital-to-analog converter of claim 1, wherein the counter output signal lines each carry a binary logic level signal that can assume either a binary logic level "0" or a binary logic level "1", each counter output signal line having a weighting value assigned thereto by the counter, the weighting values differing among all of the counter output signal lines, the weighting values of the counter output signal lines being equal to the number 2 raised to an integer exponent, the integer exponents beginning with 0 and continuing up to one less than the number of counter output signal lines, a sum total of the counter output signal lines being determinative of the internal count value of the counter, the sum total being equal to the sum of the binary logic level signal on each counter output signal line multiplied by the corresponding weighting value of that signal line.

6. The digital-to-analog converter of claim 5, wherein the counter output signal lines are connected to the comparator in an order of weighting values that is other than an order that is indicative of the counter counting in an integer ascending order.

7. The digital-to-analog converter of claim 6, wherein the counter output signal lines are connected to the comparator in an optimum order where the counter output signal lines are first placed in a weighting order where the internal count value of the counter is presented on the counter output signal lines in the integer ascending order, than the counter output signal lines are shifted left a number of times equal to the total number of counter output signal lines less two, and then a resulting number of the least significant ones of the counter output signal lines are reversed in order, the resulting number being equal to the total number of counter output signal lines less two.

8. A digital-to-pulse width converter, comprising:

a. a counter that counts between two predetermined numbers and provides its internal count value on a plurality of counter output signal lines; and b. a comparator that compares the counter internal count value on the counter output signal lines to a predetermined set point value and provides a comparator output signal at a first logic level indicative of a first type of result of a comparison of the counter output value on the counter output signal lines with the predetermined set point value and provides the comparator output signal at a second logic level indicative of a second type of result of the comparison of the counter count value on the counter output signal lines with the predetermined set point value, wherein the counter output signal lines are connected to the comparator such that the internal count value of the counter is presented to the comparator in other than an integer ascending order between the two predetermined numbers.

9. The digital-to-pulse width converter of claim 8, wherein the counter counts internally in ascending integer order beginning at zero and continuing up to a maximum number determined by a number of internal bits in the counter.

10. The digital-to-pulse width converter of claim 8, wherein the comparator provides the comparator output signal at a first logic level when the predetermined set point value is greater than the counter count value on the counter output signal lines, and the comparator provides a comparator output signal at the second logic level when a predetermined set point value is less than or equal to the counter count value on the counter output signal lines.

11. The digital-to-pulse width converter of claim 8, wherein the counter output signal lines each carry a binary logic level signal that can assume either a binary logic level "0" or a binary logic level "1" each counter output signal line having a weighting value assigned thereto by the counter, the weighting values differing among all of the counter output signal lines, the weighting values of the counter output signal lines being equal to the number 2 raised to an integer exponent, the integer exponents beginning with 0 and continuing to up to one less than the number of counter output signal lines, a sum total of the counter output lines being determinative of the internal count value of the counter, the sum total being equal to the sum of the binary logic level signal on each counter output signal line multiplied by the corresponding weighting value of that signal line.

12. The digital-to-pulse width converter of claim 11, wherein the counter output signal lines are connected to the comparator in an order of weighting values that is other than an order that is indicative of the counter counting in integer ascending order.

13. The digital-to-pulse width converter of claim 12, wherein the counter output signal lines are connected to the comparator in an optimum order where the counter output signal lines are first placed in a weighting order where the internal count value of the counter is presented on the counter output signal lines in integer ascending order, then the counter output signal lines are shifted left a number of times equal to the total number of counter output signal lines less two, and then a resulting number of the least significant ones of the counter output signal lines are reversed in order, the resulting number being equal to the total number of counter output signal lines less two.

14. A digital-to-pulse width converter, comprising:

a. counter means for counting in integer ascending order between zero and a predetermined maximum value determined by a number of internal bits in the counter means, and for providing a plurality of output signal lines that each carry a binary logic level signal, a sum total of the binary logic level signals on the output signal lines being indicative of an internal count value of the counting means, each output signal line having a weighting value assigned thereto equal to the number 2 raised to an integer exponent, the integer exponents beginning with 0 and ascending to an integer that is one less than the number of output signal lines; and b. comparator means for comparing the internal count value of the counter means on the output signal lines to a predetermined set point value and for providing an output signal at a first logic level indicative of a first type of result of the comparison of the count value on the output signal lines with the predetermined set point value, and for providing the output signal at a second logic level indicative of a second type of result of the comparison of the count value on the output signal lines with the predetermined set point value, wherein the output signal lines from the counter means are connected to the comparator means such that the internal count value of the counter means is presented to the comparator means in other than integer ascending order between the two predetermined numbers.

15. The digital-to-pulse width converter of claim 14, wherein the output signal lines from the counter means each carry a binary logic level signal that can assume either a binary logic level "0" or a binary logic level "1", each output signal line from the counter means having a weighting value assigned thereto by the counter means, the weighting values differing among all of the output signal lines of the counter means, the weighting values of the output signal lines being equal to the number 2 raised to an integer exponent, the integer exponents beginning with 0 and continuing up to one less than the number of output signal lines of the counter means, a sum total of the output signal lines of the counter means being determinative of the internal count value of the counter means, the sum total being equal to the sum of the binary logic level signal on each output signal line of the counter means multiplied by the corresponding weighting value of that signal line.

16. The digital-to-pulse width converter of claim 15, wherein the output signal lines of the counter means are connected to the comparator means in an order of weighting values that is other than an order that is indicative of the counter means counting in an integer ascending order.

17. The digital-to-pulse width converter of claim 16, wherein the output signal lines from the counter means are connected to the comparator means in an optimum order where the output signal lines from the counter means are first placed in a weighting order where the internal count value of the counter means is presented on the output signal lines in integer ascending order and then the output signal lines are shifted left a number of times equal to the total number of output signal lines of the counter means less two, and then a resulting number of the least significant ones of the output signal lines of the counter means are reversed in order, the resulting number being equal to the total number of output signal lines of the counter means less two.

\* \* \* \* \*